United States Patent [19]

Havemann

[11] Patent Number: 4,774,204

[45] Date of Patent: Sep. 27, 1988

[54] METHOD FOR FORMING SELF-ALIGNED EMITTERS AND BASES AND SOURCE/DRAINS IN AN INTEGRATED CIRCUIT

[75] Inventor: Robert H. Havemann, Garland, Tex.

[73] Assignee: Texas Instruments Incorporated, Dallas, Tex.

[21] Appl. No.: 57,871

[22] Filed: Jun. 2, 1987

[51] Int. Cl.[4] .................... H01L 21/74; H01L 21/265
[52] U.S. Cl. ..................... 437/054; 148/DIG. 140; 148/DIG. 147; 357/42; 357/91; 437/29; 437/34; 437/192; 437/193; 437/200
[58] Field of Search .................. 437/34, 29, 54, 192, 437/193, 200; 357/42, 91

[56] References Cited

U.S. PATENT DOCUMENTS

| | | | |
|---|---|---|---|
| 4,437,897 | 3/1984 | Kemlage | 437/31 |
| 4,445,268 | 5/1984 | Hirao | 437/31 |
| 4,450,620 | 5/1984 | Fuls et al. | 29/571 |
| 4,484,388 | 11/1984 | Iwasaki | 437/31 |
| 4,495,010 | 1/1985 | Kranzer | 437/31 |
| 4,505,027 | 3/1985 | Schwabe et al. | 29/577 C |
| 4,558,507 | 12/1985 | Okabayashi et al. | 29/571 |
| 4,575,920 | 3/1986 | Tsunashima | 437/192 |
| 4,597,163 | 7/1986 | Tsang | 29/576 B |
| 4,616,405 | 10/1986 | Yasuoka | 437/34 |
| 4,619,038 | 10/1986 | Pintchovski | 437/193 |

FOREIGN PATENT DOCUMENTS 0066280 12/1982 European Pat. Off. ...... 148/DIG. 9

OTHER PUBLICATIONS

Li et al, IEEE-Electron Device Lett's, EDL-8, (1987), 338.

Primary Examiner—Upendra Roy
Attorney, Agent, or Firm—Rodney M. Anderson; Leo N. Heiting; Melvin Sharp

[57] ABSTRACT

A method for forming a BICMOS device having MOS devices and bipolar devices formed during the same process includes the step of first forming bipolar MOS regions and then forming gate electrodes in the MOS regions and poly emitters in the bipolar regions. The gate electrodes and bipolar regions have a layer of refractory metal formed on the upper surface thereof and covered by a protective cap. The extrinsic bases formed on either side of the emitter electrode and the source/drain regions are formed on either side of the gate electrode by forming a layer of silicide and implanting the layer of silicide with p-type impurities which are subsequently driven downward into the substrate. The protective cap prevents the p-type impurities from being introduced into the poly emitter.

22 Claims, 5 Drawing Sheets

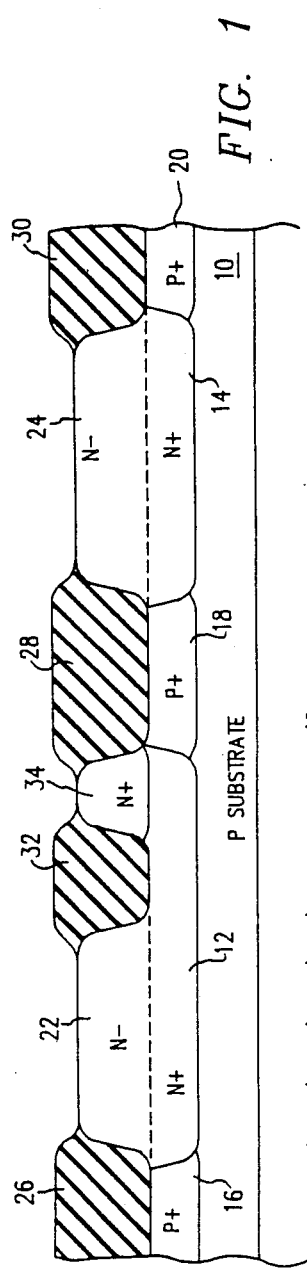
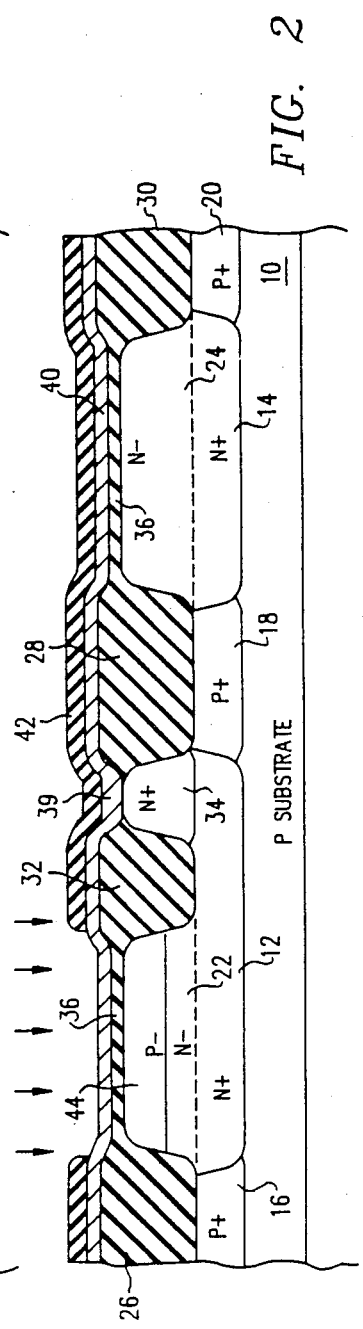
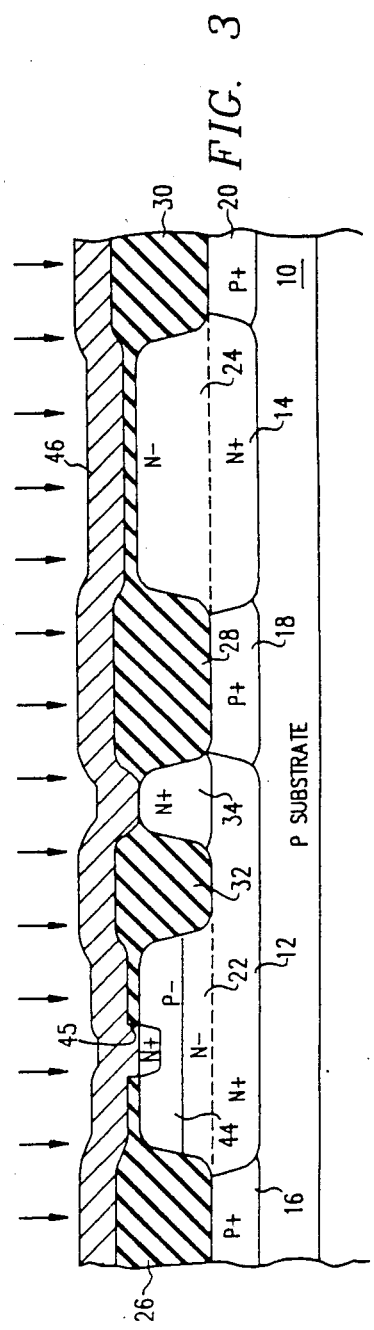

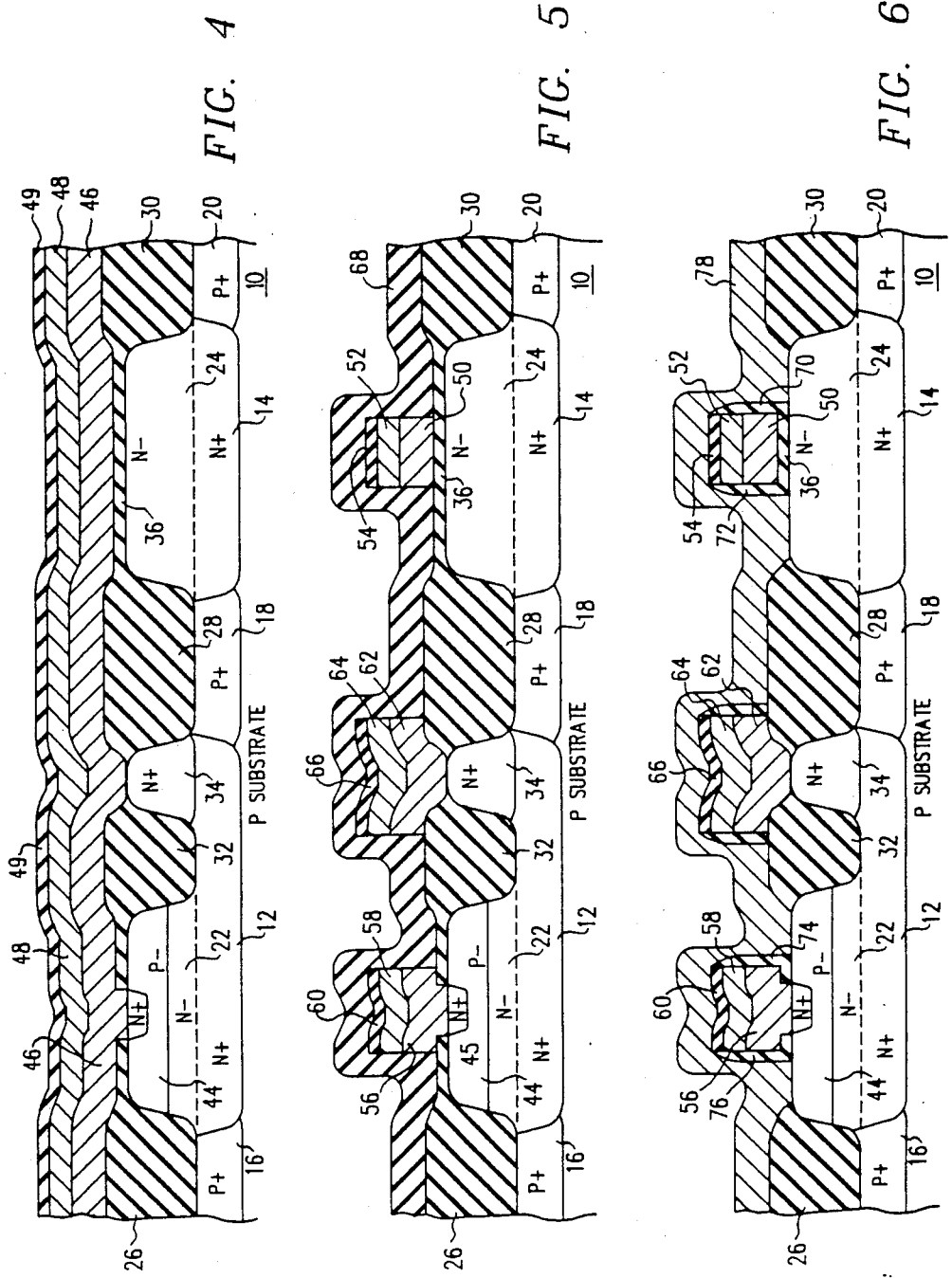

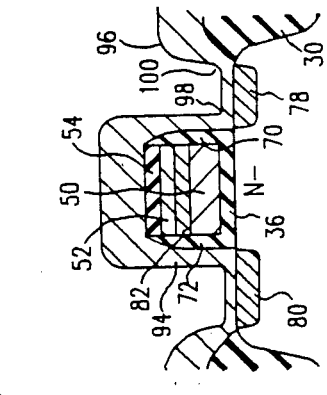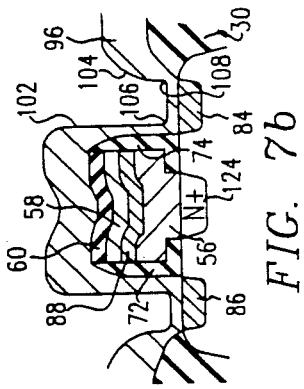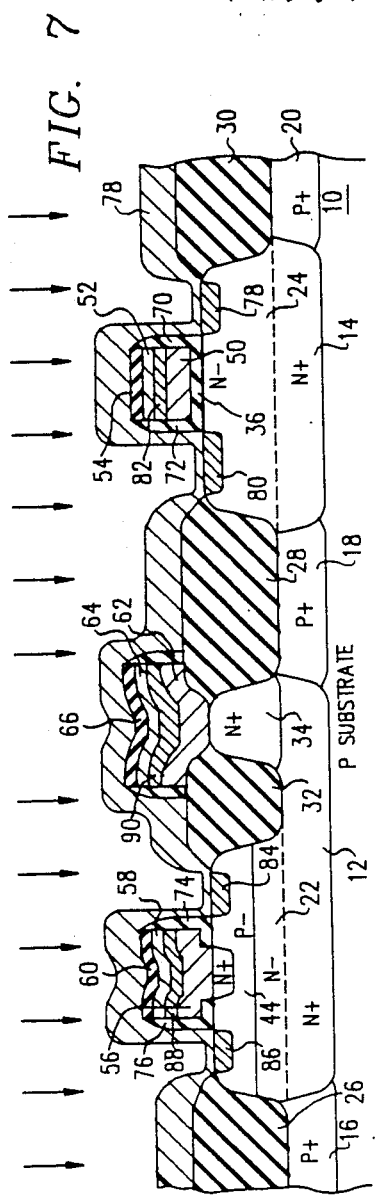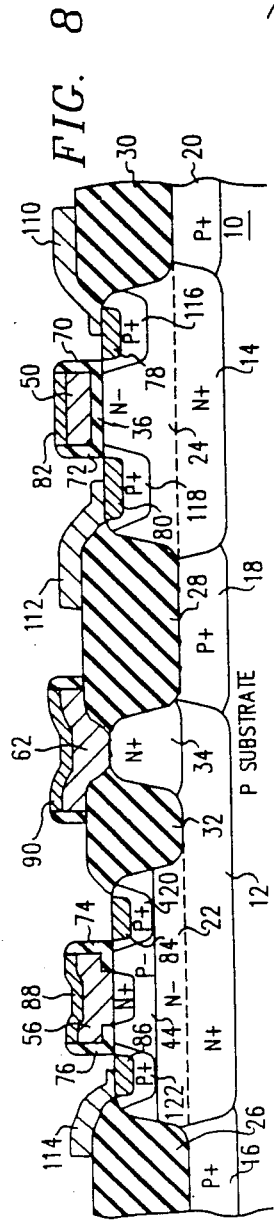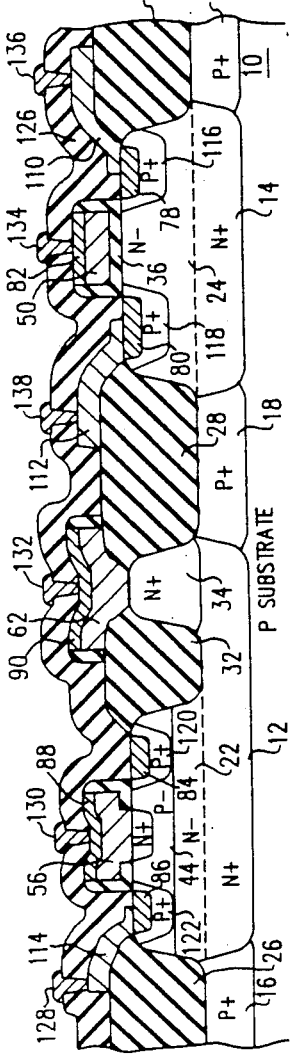

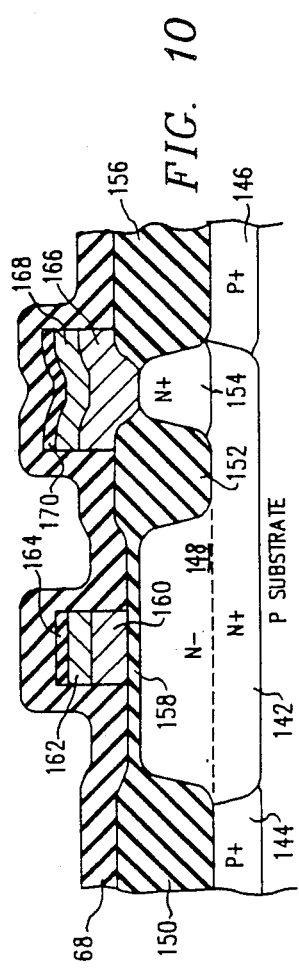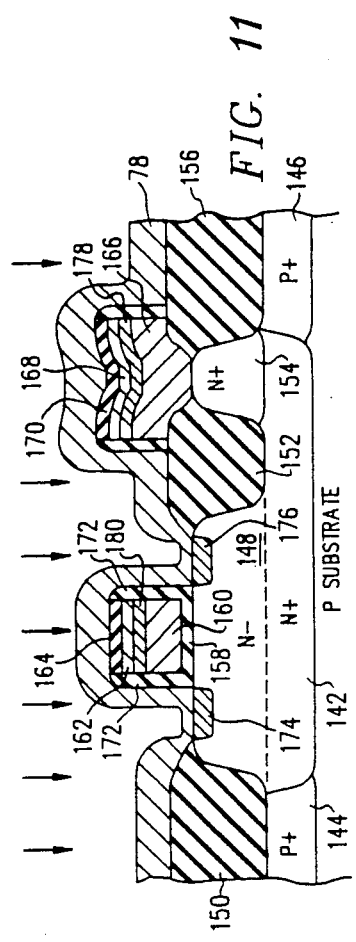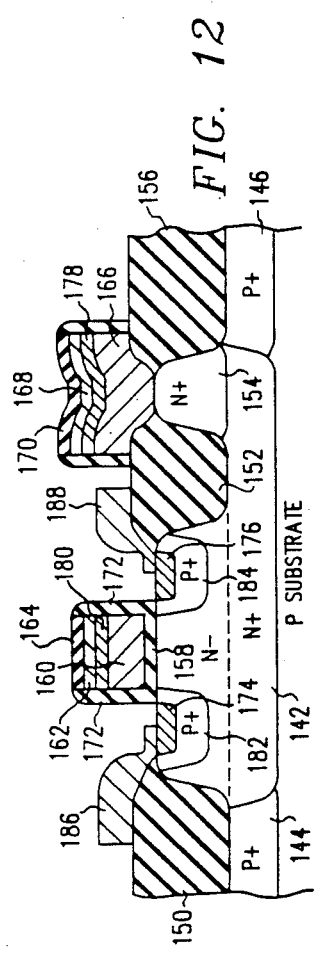

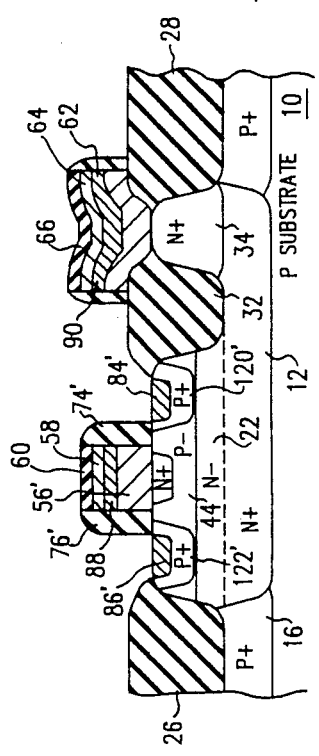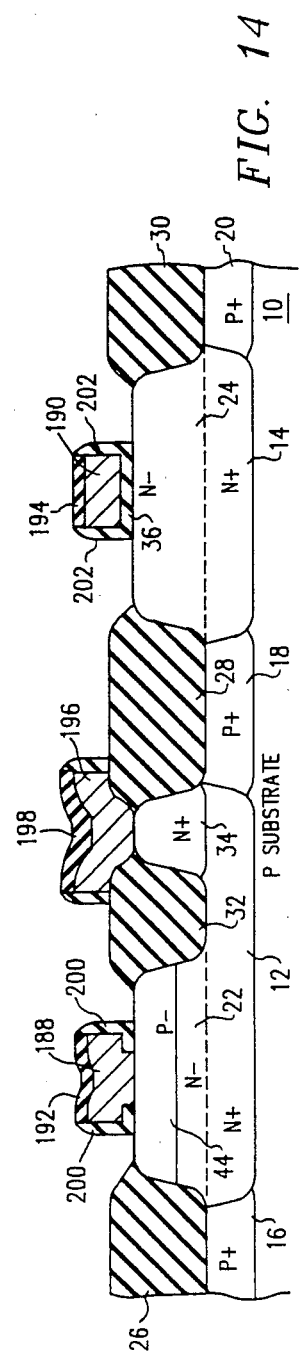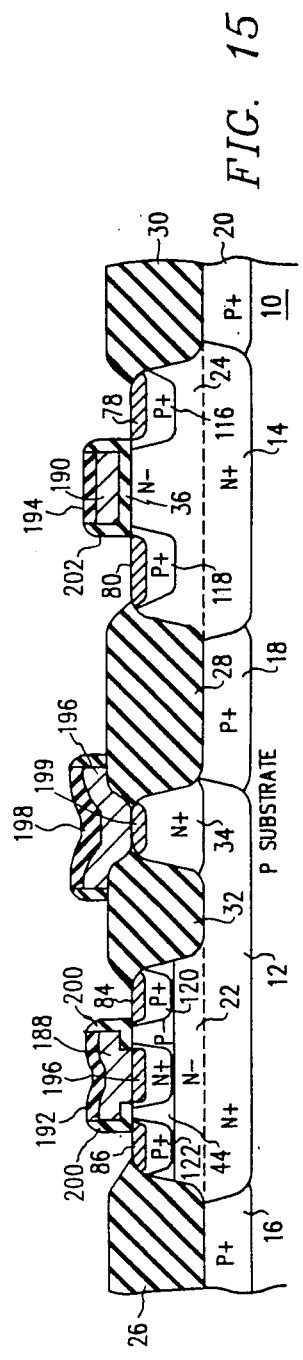

METHOD FOR FORMING SELF-ALIGNED EMITTERS AND BASES AND SOURCE/DRAINS IN AN INTEGRATED CIRCUIT

TECHNICAL FIELD OF THE INVENTION

The present invention pertains in general to a BICMOS process for forming bipolar and MOS transistors and, more particularly, to the process for forming the base of an NPN device and the source/drain of an MOS device with shallow silicided junctions.

CROSS REFERENCE TO RELATED APPLICATIONS

This application is related to U.S. patent applications Ser. No. 032,836 filed Mar. 31, 1987, Ser. No. 045,978 filed May 1, 1987, and Ser. Nos. 008,906 and 008,910, both filed Jan. 30, 1987; all of these applications are assigned to Texas Instruments Incorporated.

BACKGROUND OF THE INVENTION

The integration of FET structures, using p-channel transistors (PMOS) and n-channel transistors (NMOS), with bipolar transistors has seen increasing use in recent years. These devices are referred to as BICMOS devices. The use of the bipolar transistors as driving elements for the MOS devices improves the speed characteristics of the overall device. The bipolar transistors are characterized by high transconductance which is well suited for driving capacitive loads.

One disadvantage of integrating an MOS device and a bipolar device in the same circuit is that the steps in fabricating the bipolar device differ somewhat from the steps required to fabricate MOS devices. This may necessitate separate fabrication steps for the bipolar devices and the MOS devices which could result in an overly complex process since numerous thermal cycles would be required. In order to accommodate these two processes, there has been a trend towards combining fabrication steps to form various elements of the two devices.

One of the more important structures in both the bipolar device and the MOS device are the semiconductor junctions which form the emitter and the extrinsic base of the bipolar transistor and the source/drains of the MOS device. With present technology, these structures are formed by implanting impurities into the substrate to provide a relatively thin region of impurities of the proper conductivity type and then the impurities driven down into the substrate with subsequent annealing steps to form a metallurgical junction at a predetermined depth. However, formation of both the MOS device and the bipolar device requires these junctions to be accurately aligned with respect to other structures on the substrate. This alignment becomes somewhat difficult when junctions are formed at different steps in the process and when interceded by thermal cycles.

In view of the above disadvantages, there exists a need for an improved process for forming BICMOS devices wherein the emitter and base junctions in the bipolar device and the source/drain junctions of the MOS devices are fabricated with a minimum number of process steps and are exposed to a minimum number of thermal cycles in the process.

SUMMARY OF THE INVENTION

The present invention disclosed and claimed herein comprises the process for forming a BICMOS device with shallow silicided junctions with a poly emitter formed in the bipolar transistor. Bipolar and MOS regions are first defined in the substrate and then a doped polysilicon emitter and poly gates are formed in the bipolar and MOS regions, respectfully. A layer of refractory metal is disposed over the poly emitter and gates and a protective cap then formed thereover. A second layer of refractory metal is then disposed over the substrate to cover the extrinsic base region of the bipolar transistor and the source/drain regions of the MOS transistor. The refractory metal of the first and second layers is then reacted to form a silicide with the exposed silicon and polysilicon surfaces followed by an implant step to introduce impurities into the silicide layers in the intrinsic base region of the bipolar transistor and the source/drain regions of the MOS transistor. The impurities in the silicide layer are then driven down into the substrate to form metallurgical junctions and the doped impurities in the emitter of the bipolar transistor are driven down into the substrate to form the emitter junction of the bipolar transistor. The protective cap over the emitter prevents impurities from being introduced therein during implanting of the silicide for the extrinsic base region.

In another embodiment of the present invention, a lateral PNP transistor is formed by forming a spacer of polycrystalline silicon over one of the bipolar regions during the formation of the emitter electrode 40 and NPN bipolar transistor. The polysilicon spacer defines the spacing between the emitter and collector. The polysilicon spacer is separated from the substrate by an oxide layer with the emitter and collector of the PNP transistor formed on either side thereof during the formation of the extrinsic base region of the NPN bipolar transistor.

A technical advantage is provided by the present invention in that a doped poly emitter electrode is formed with a protective cap disposed thereover prior to forming the extrinsic base regions adjacent the emitter electrode and the source/drain junctions of the MOS transistors. The protective cap over the poly emitter prevents introduction of opposite conductivity type impurities during formation of silicided junctions. A further technical advantage is provided in that the source/drain junctions of the MOS transistor are formed at the same time the extrinsic base regions are formed in the bipolar transistor with the refractory layer metal providing an offset between the edges of the source/drain regions and the channel region and also providing an offset between the edge of the emitter electrode and the extrinsic base region. A yet further technical advantage is provided by forming a layer of refractory metal between the surface of the poly emitter and the protective cap.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a cross-sectional diagram of a silicon substrate after forming MOS and bipolar regions with a buried collector;

FIG. 2 illustrates a cross-sectional diagram illustrating the step of implanting the intrinsic base;

FIG. 3 illustrates a cross-sectional diagram after formation of the poly silicon layer utilized to form the gates and the emitters;

FIG. 4 illustrates the step of forming a protective cap over the poly layer;

FIG. 5 illustrates the step of patterning the protective cap to form the gate electrodes and the emitter of a bipolar transistor.

FIG. 6 illustrates the step of forming a sidewall oxide on the MOS gate electrode and the bipolar emitter and forming the second layer of titanium over the substrate;

FIG. 7 illustrates the step of reacting the titanium and implanting impurities into the titanium disilicide;

FIG. 7a illustrates a detail view of the gate electrode of the MOS transistor of FIG. 8;

FIG. 7b illustrates a detail view of the emitter and the bipolar transistor of FIG. 8.

FIG. 8 illustrates the step of driving the impurities into the substrate to form the junctions and patterning the local interconnects;

FIG. 9 illustrates the step of forming the interlevel oxide and contacts;

FIG. 10 illustrates a cross-sectional diagram of one step in the formation of a lateral PNP transistor at the stage of processing illustrated in FIG. 5;

FIG. 11 illustrates a cross-sectional diagram of the lateral PNP transistor at the processing stage illustrated in FIG. 7;

FIG. 12 illustrates the lateral PNP transistor at the stage of processing illustrated in FIG. 8 wherein local interconnects are formed;

FIG. 13 illustrates formation of the emitter of the bipolar transistor without the lateral spacing; and FIGS. 14 and 15 illustrate the process for forming the emitter and gate electrodes with a refractory metal.

DETAILED DESCRIPTION OF THE INVENTION

Referring now to FIG. 1, there is illustrated a cross-sectional diagram of one step in the fabrication process for a BICMOS device illustrating the fabrication of a NPN transistor and a PMOS transistor. However, it should be understood that an NMOS transistor can also be fabricated in conjunction with the NPN transistor, as will be described in more detail hereinbelow.

In conventional fabrication of bipolar integrated circuits, a thin wafer of P-type semiconductor material, such as that identified by reference numeral 10 in FIG. 1, is provided and two n+ semiconductor areas 12 and 14 are formed by implanting an impurity such as antimony into the substrate with a dose of about $5 \times 10^{15}$ ions/cm$^2$ at an implant energy of approximately 40 Kev. The substrate is then subjected to an annealing step to drive the implanted areas 12 and 14 downward, followed by an implant of p-type impurities to form p-type regions 16, 18 and 20. The p-type regions are formed by implanting boron to a dosage of about $1.0 \times 10^{13}$ ions/cm$^2$ at an energy of 60 Kev. After formation of the n— and p-buried layers, an n-type epitaxial layer is formed on top of the substrate into which the tanks of the bipolar and MOS transistors will be formed. The epitaxial layer is implanted with an n-type impurity such as phosphorus to a dosage of approximately $1.5-2.5 \times 10^{12}$ ions/cm$^2$ at an energy of about 80 Kev and annealed to form an n— tank 22 which will be utilized for the bipolar transistor and an n— tank 24 to be utilized for the MOS transistor. Thick field oxide regions 26 and 28 are formed to isolate the bipolar transistor region with the thick field oxide region 28 and a thick field oxide region 30 operable to isolate the MOS transistor region. An additional thick field oxide layer 32 is provided between the field oxide regions 26 and 28 to define a collector region of the bipolar transistor region.

The field oxide is formed by subjecting the substrate to a steam oxidization step at approximately 900° Centigrade to form an oxide thickness of approximately 8000 angstroms. Nitride selectively prevents growth of oxide over the n-regions 22 and 24 and also in a collector region 34. The substrate 10 is subjected to a threshold adjust implant over the entire surface to establish a desired threshold voltage by which the MOS transistors can be turned on, these MOS transistors are formed in the n— tank 24. The collector region is selectively implanted with phosphorus to a dosage of approximately $2-3 \times 10^{16}$ ions/cm$^2$ at an energy level of about 100 Kev to make the collector region 34 n+, which region is referred to as a deep collector. The region 34 is a heavily doped region that extends into the n+ buried collector 12. Although not shown, a p— region can be formed adjacent to the n— region 24 and separated therefrom by a region of thick field oxide. An NMOS device can be formed in the p— region. For simplicity purposes, only the PMOS device will be described herein.

After formation of the structure illustrated in FIG. 1, the silicon surface in the n— tank 22 and the n-tank 24 are subjected to a wet etch to expose the silicon, and then the substrate 10 resubjected to an oxidation environment, wherein a gate oxide layer 36 is formed over the n— region 24 and n— region 22, as illustrated in FIG. 2. The oxide layer 36 is formed to a thickness of approximately 200-300 angstroms and forms the insulator that will be disposed between the gate electrode and the underlying silicon surface, which region will form the channel of the PMOS transistor.

After formation of the gate oxide layer 36, a layer 40 of polycrystalline silicon is deposited over the entire surface of the to a thickness of approximately 1000 angstroms. It is important to deposit the polysilicon layer 40 as soon as possible after formation of the gate oxide layer 36 since the integrity of this layer is important with respect to the operating characteristics of the PMOS device. A layer of resist 42 is formed on the substrate 10 and then patterned to expose only the n— tank region 22 in the bipolar transistor. The substrate 10 is then subjected to an ion implant step to implant an intrinsic p— base region 44. This implant is conducted with a boron dosage of approximately $1-2 \times 10^{14}$ ions/cm$^2$ at an energy level of about 80 Kev. The implanted region 44 is initially a relatively thin region which becomes thicker with subsequent thermal processing steps. The photoresist layer 42 is then stripped and the substrate subjected to a threshold adjust implant which is a relatively light implant. However, for simplicity purposes, the region 44 is shown in its final thickness relative to the n— tank 22.

After formation of the intrinsic p— base 44 and threshold implant, the poly layer 40 is patterned and etched to form a first opening to expose the surface of the silicon proximate to the n+ deep collector 34 and a second opening 45 in the bipolar region to define the emitter of the bipolar transistor. A second and thicker layer of polycrystalline silicon is then deposited to a thickness of approximately 3000 angstroms which merges with the already deposited layer 40 to form a resultant layer 46 which is approximately 4000 angstroms in thickness. The result of the structure is illustrated in FIG. 3. The layer 46 is then implanted with n-type impurity such as arsenic at a dosage of approximately $1.0 \times 10^{16}$ ions/cm$^2$ at an energy of 100 Kev to provide a doped polysilicon layer. This is then annealed at approximately 1000° C. for twenty minutes. After implantation of the poly layer 46, a layer 48 of titanium, which is refractory metal, is sputtered onto the substrate 10 in a vacuum apparatus to a thickness of approximately 1000 angstroms. This is a conformal layer which will overlie the exposed surface of poly layer 46. A layer of oxide 49 is then deposited over the top of the titanium layer 48 to provide a protective cap. This structure is illustrated in FIG. 4.

After formation of the poly layer with the overlying titanium and oxide layers 48 and 49, the substrate is patterned and etched to form a poly gate electrode 50 having a titanium layer 52 and an oxide layer 54 disposed on the upper surface thereof, and n+ emitter 56 having a titanium layer 58 and an oxide layer 60 disposed on the upper surface thereof and a collector electrode 62 having a layer of titanium 64 and a layer of oxide 66 disposed on the upper surface thereof. The titanium layers 52, 64 and 58 were originally a part of the titanium layer 48 and the oxide layers 54, 66 and 60 were originally part of the oxide layer 49.

After formation of gate electrode 50, emitter electrode 56 and collector electrode 62, a conformal oxide layer 68 is deposited over the entire substrate to a thickness of approximately 300–500 angstroms thereby encapsulating the gate electrode 50, emitter electrode 56 and collector electrode 62 to form the structure of FIG. 5. This deposition is performed with a low pressure chemical vapor deposition process (LPCVD) which occurs at a relatively low temperature, preferably below 700°. At temperatures above 700°, the titanium layers 52, 58 and 64 will react to some extent with the underlying polysilicon to form titanium disilicide, which is a refractory material. The substrate could be subjected to a temperature of approximately 800° Centigrade for approximately thirty minutes to complete this reaction. However, this is performed later in the process, as will be described hereinbelow, to minimize the number of thermal cycles. Although some of the titanium may react to form titanium disilicide, the process is incomplete at this step in the process, and, as such, it is not shown.

After deposition of the oxide layer 68, the oxide layer is then subjected to an anisotropic etch in a vertical direction to clear the oxide from flat surfaces. This etch leaves a sidewall oxide 70 on one side of the gate electrode 50 and a sidewall oxide 72 on the other side of the gate electrode 50. A sidewall oxide 74 is also formed on one side of the emitter electrode 56 and sidewall oxide 76 is formed on the opposite side of the emitter electrode 56. Since the oxide layer 68 in FIG. 5 was 300 angstroms thick, the resultant thickness of the sidewall oxide is approximately 300 angstroms. The purpose of the sidewall oxide layers 70–76 is to seal the vertical surfaces of the gate electrode 50 and the emitter electrode 56, as will be more clearly described hereinbelow. Further, a sidewall oxide is also formed on the collector electrode 62. The process for forming sidewall oxides is described in U.S. Pat. No. 4,356,040 issued to Hornqsen Fu et al., on Oct. 26, 1982 and assigned to Texas Instruments, Inc.

After forming the sidewall oxide layers 70–76, a layer 78 of titanium is sputtered onto the top of the substrate to a thickness of approximately 1000 angstroms. This layer is formed in a similar manner to the layer 48 in FIG. 4. This is a conformal layer that will overlie the exposed silicon surfaces on either side of the gate electrode 50 exterior to the sidewall oxide layers 70 and 72 and on either side of the emitter electrode 56 exterior to the sidewall oxide layers 74 and 76. Typically, sputtering of the titanium layer 78 is preceded by a wet etch in 1.0% hydrochloric acid to insure that no residual oxide remains on any of the exposed silicon surfaces. This resulting structure is illustrated in FIG. 6.

After formation of the titanium layer 78, the titanium is reacted at a temperature of approximately 675° C. in an atmosphere of argon and nitrogen for approximately thirty minutes. This will result in any unreacted titanium in the titanium layers 52, 58 and 60 for overlying the gate electrode 50, the emitter electrode 56 and collector electrode 62, respectively, to also be reacted. This reaction allows the portions of the titanium that are adjacent silicon or polysilicon to consume silicon and form titanium disilicide. This reaction will result in a silicide layer being formed. In the MOS transistor, a silicide layer 78 is formed in the n− tank 24 between the sidewall oxide layer 70 and the field oxide layer 30. A siicide layer 80 is formed between the sidewall oxide layer 72 and the field oxide layer 28. Silicide layers 78 and 80 are formed in areas generally referred to as the source/drain of the MOS transistor. In a similar manner, a silicide layer 82 is formed on the upper surface of the gate electrode 50. A silicide layer 84 is formed in the p− intrinsic base region 44 between the sidewall oxide layer 74 and the field oxide layer 32. A silicide layer 86 is formed in the p− intrinsic base 44 between the sidewall oxide layer 76 and the field oxide layer 26. A silicide layer 88 is formed on the upper surface of emitter electrode 56 and a silicide layer 90 is formed on the upper surface of collector electrode 62. The silicide layers 84 and 86 define the emitter region of the bipolar transistor.

During reaction, the titanium layers 52, 58 and 64 are converted to titanium disilicide only on the surface adjacent the polysilicon, which reaction consumes both the titanium and the silicon. The surface adjacent to the oxide layers 54, 60 and 66 will be converted to titanium oxide. With respect to the titanium layer 78, the only portions of this layer which remain overlie the oxide. Since the titanium in layer 78 was reacted in an argon and nitrogen atmosphere, a portion of the exposed surface of the titanium layer will be converted to titanium nitride. In addition, a portion of the unsilicided titanium in the layers 78 adjacent the underlying oxide will be converted to titanium oxide. The resultant structure is illustrated in FIG. 7.

After the titanium is reacted with the exposed silicon and polysilicon surfaces to form titanium disilicide, the substrate is then subjected to an implant of p-type impurities through the surface of the exposed portion of the titanium layer 78 and into the silicide layers 78, 80, 84 and 86. Although not shown, if an NMOS transistor were being formed with n-type source/drains, it would be necessary to mask off the NMOS transistor region and implant n-type impurities. It is important to note that the p-type impurities are not implanted into the silicide layers 82, 88 and 90 which will form the first titanium layer since the presence of p-type impurities in the n− doped emitter electrode 56 would result in counter doping and would affect any subsequent diffusion downward into the substrate and formation of the emitter region, as will be described hereinbelow. The implanted p-type impurities can be any basic source/drain implant, and, in the preferred embodiment, the implant utilizes boron which is implanted at an energy of approximately 50 kev with a dosage of approximately $5 \times 10^{15}$ion/cm$^2$. If an NMOS transistor is utilized, this will require masking off the bipolar region and PMOS transistor regions to prevent n-type impurities entering the source/drain regions or base regions. The dosage of the p-type impurities and the depth to which they are implanted is a function of the desired characteristics of both the bipolar and MOS transistors and may be adjusted accordingly.

A detail of the sidewall oxide layers 70 and 72 is illustrated in FIG. 7a. As described above, after formation of the silicide layers 78 and 80, a portion of the titanium layer 78 is not reacted to form titanium disilicide. This results in a portion 90 overlapping the sidewall oxide layer 70, a portion 94 overlying the sidewall oxide layer 72 and a portion 96 overlying the field oxide layer 30. As described above, the portions 92-96 react to form titanium nitride and/or titanium oxide. Since the unreacted portions of the titanium layers remain on the substrate during the ion implantation step, the implanted impurities are spaced away from the edge of the sidewall oxide layer 70 and the edge of the field oxide layer 30. The impurities are only implanted into the substrate 10 between a point 98 and a point 100 in the surface of the silicide layer 78. The point 98 is spaced from the vertical side of the gate electrode 50 by a distance equal to the combined thickness of the sidewall oxide layer 70 and the portion 92 of the titanium layer 78.

A detail of the silicide layers 84 and 86 formed in the bipolar transistor region is illustrated in FIG. 7b. The titanium layer 78, after reaction thereof to form titanium disilicide layers 84 and 86, leaves an unreacted portion 102 overlying the sidewall oxide 74 and an unreacted portion 104 overlying the field oxide layer 32. This results in impurities being implanted into the silicide layer 84 only between a point 106 and a point 108. The point 106 is effectively spaced away from the edge of the emitter electrode 56 by a distance equal to the thickness of the sidewall oxide layer 74 and the portion 102 of the titanium layer 78.

In order to prevent impurities from passing through the portion of the titanium layer 78 that overlies the emitter electrode 56 and passing through the protective oxide layer 60 into the silicide layer 88 on the upper surface of the emitter electrode 56, the energy of the p-implant is such that it will be located within the silicide layers 84 and 86 and, as such, the energy will be insufficient to drive a significant portion of the impurities into the unreacted titanium layer over the emitter electrode 56. Once the majority of the impurities are implanted into the portion of the titanium layer 78 overlying the protective oxide cap 60, subsequent diffusion due to thermal cycling will be blocked in the downward direction by the oxide layer 60, since the diffusion coefficient of oxide is very low. In this manner, the protective oxide cap 60 performs the function of a mask. Although oxide was utilized, an oxide/nitride mask can also be utilized which would require an additional processing sep after formation of the titanium layer 48 with reference to FIG. 4.

After implanting the p-type impurities into the silicide layers 78, 80, 84 and 86, the substrate is then patterned to form local interconnects and then etched in an acid solution to remove the unreacted portions of the titanium layer 78 that are not patterned for local interconnects. The titanium disilicide is not removed by this process and the portions of the titanium nitride also remain in accordance with a predetermined pattern. For example, a suitable etching in the case of titanium is a wet etch comprising a solution of $H_2SO_4$ and $H_2O_2$. Since titanium only reacts with silicon or polycrystalline silicon to form a silicide, the unpatterned portions covering the field oxide layers have unsilicided titanium removed therefrom. The wet etch will attack both titanium nitride and titanium oxide, such that no conductive layer remains behind other than the patterned titanium nitride or titanium disilicide. The resultant structure after removing the unpatterned portions of the unreacted titanium is illustrated in FIG. 8. The titanium disilicide process is described in U.S. Pat. No. 4,545,116 issued to C. K. Lau on Oct. 8, 1985, assigned to Texas Instruments, Inc.

The patterned titanium nitride will result in a local interconnect 110 connected at one end to the silicide layer 78 and the other end overlying the field oxide layer 30. A local interconnect 112 will be formed having one end thereof connected to the silicide layer 80 and the other end thereof overlying the field oxide layer 28. A local interconnect 114 will be formed in the bipolar transistor for connection to the base having one end thereof connected to the silicide layer 86 and the other end thereof overlying the field oxide layer 26.

After the impurities are implanted in the silicide layers 78, 80, 84 and 86, and the unreacted and unpatterned titanium removed, the substrate is then annealed for thirty minutes at a temperature of approximately 800° C. in an atmosphere of argon to stabilize and further lower the resistivity of the titanium disilicide. Titanium disilicide increases the conductivity of all silicon or polysilicon areas over which it was formed and constitutes a self-aligned process. In addition, the impurities are driven down into the silicon of the substrate to form a metallurgical junction beneath the silicide layer 78, 80, 84 and 86.

When the dopant that was originally implanted into the silicide layers 78, 80, 84 and 86 adjacent the lowermost junction is diffused outward and downward into the substrate by the annealing step, there will be diffusion in two directions. The first direction will be downward into the substrate and the second direction will be lateral. The downward diffusion is termed the "depth". In the preferred embodiment, and after all thermal cycling in the substate is complete, this will result in a junction which is approximately 1500 angstroms deep with a lateral diffusion of approximately 1000 angstroms. This forms a p+ region 116 beneath the silicide layer 78 and the p+ region 118 beneath the silicide layer 80. A p+ region 120 is formed beneath the silicide layer 84 and a p+ region 122 is formed beneath the silicide layer 86. The p+ regions 116 and 118 form the source drains of the MOS transistor and the p+ regions 120 and 122 form the extrinsic base of the bipolar transistor.

With further reference to FIG. 8, it can be seen that the edges of the p+ regions 116 and 118 adjacent the channel region underlying the gate electrode 50 are offset from the edge of the gate by a dimension which is determined by the thickness of the sidewall oxide layers 70 and 72 and the thickness of the titanium layer 78 that was sputtered onto the substrate. The offset is a matter of design choice and is utilized to account for the lateral diffusion of the p+ regions 116 and 118. The edge of the p+ regions 116 and 118 are nominally aligned with the edges of the channel region underlying the gate electrode 50.

In the NPN bipolar transistor, the emitter electrode 56 is heavily doped. Since it contacts the substrate, the dopants will diffuse downward into the substrate as a result of thermal cycling. With the process of the present invention, the thermal cycling is minimized such that the dopants are not initially driven down into the substrate after the step of patterning of the second poly layer 46 and subsequent patterning of the emitter electrode 56. However, some thermal cycling exists, and as such, there will be some downward diffusion. Since there are going to be a number of thermal cycles involved in forming the various levels of oxide and titanium disilicide, arsenic is the preferred dopant. Arsenic requires a thermal cycle at approximately 1000° C. for fifteen minutes to provide the appropriate drive downward into the substrate to form the desired metallurgical junction. The result of the thermal cycling is an n+ region 124 that forms the emitter of the bipolar transistor contacting the emitter electrode 56.

With respect to the p+ region 120 and 122 and the n+ region 124 in the bipolar transistor, it is only that the distance between the edges of the p+ regions 120 and 122 and the edges of the n+ region 124 are proximate to each other and spaced approximately 1600-2500 angstroms apart. The sidewall oxide layers 74 and 76 adjacent the sides of the emitter electrode 56 provide this spacing and constitute a self-aligned process.

After the p+ regions 68 and 70 which form the source/drain junctions of the MOS transistor are formed and the p+ extrinsic base regions 120 and 122 of the bipolar transistor are formed, an interlevel of oxide is deposited over the surface of the substrate and then patterned to form openings for metal transistor contacts. This is illustrated in FIG. 9. This results in a layer of interlevel oxide 126 being formed over the substrate. A base contact 128 is then formed contacting the local interconnect 114, an emitter contact 130 is formed contacting the silicide layer 88 overlying the electrode 56 and a collector contact 132 is formed to contact the silicide layer 90 overlying the collector electrode 62 of the bipolar transistor. In the MOS transistor, a gate contact 134 is formed contacting the silicide layer 82 overlying the gate electrode 50, a source/drain contact 136 is formed contacting the local interconnect 110 and a source/drain contact 138 is formed contacting the local interconnect 112.

Referring now to FIG. 10 there is illustrated a cross-sectional diagram of a lateral PNP transistor at the processing stage illustrated in FIG. 5. Like numerals refer to like structures in the various figures. An N+ region 142, similar to the N+ region 12, is formed in the substrate and bounded on either side thereof by a p+ region 144 and 146, p+ regions 144 and 146 being similar to p+ regions 16-20. An n— epitaxial region 148 is formed above the n+ region 142 and is similar to the n— regions 22 and 24. Field oxide is then grown on the substrate 10 to form a field oxide region 150 and 152 on either side of the n— region 148 and n+ region 154 is formed and separated from the remaining circuitry by field oxide layer 156. The n+ region 154 is formed in a manner similar to that of the deep collector 34. This will result in a structure similar to the bipolar transistor of FIG. 2 with the exception of the intrinsic base 44. During implanting of the intrinsic base 44, as illustrated in FIG. 2, the mask 42 is extended to overly the n— region 148 to prevent impurities from being implanted in the n— region 148.

After formation of the n— region 148 and n+ region 154, the doped poly layer 46, a layer of oxide 158 is formed over n— region 148 to a thickness equal to oxide layer 38 in FIG. 2. The attending titanium layer 48 and oxide mask 49 are then disposed on the substrate 10. However, it is important to note that no opening was disposed in the oxide layer 158 similar to the opening 45 in oxide layer 38 of the NPN bipolar transistor. Therefore, the dopant that was implanted into the poly layer 46 will not diffuse downward into the substrate through the oxide layer 158. This is an important difference between the lateral PNP transistor and the NPN transistor formation.

The resulting structure is then patterned to form the gate electrode 50 of the MOS transistor and the emitter electrode 56 of the NPN transistor as illustrated in FIG. 5. However, a spacer 160 is also patterned over the N— region 148 which is separated therefrom by the oxide layer 158. The spacer 160 has a layer of titanium 162 and an oxide cap 164 formed on the upper surface thereof which are similar to the titanium layer 58 and oxide cap 60 of FIG. 5 over the emitter electrode 56. In a similar manner, a base electrode 166 is formed overlying the N+ region 154 and in contact therewith.

A titanium layer 168 and an oxide cap 170 are disposed over the base electrode 166. Base electrode 166 is similar to collector electrode 162 and the overlying structure 64 and 66 of FIG. 5. The layer of oxide 68 is then disposed over the substrate for purposes of forming sidewall oxides. This results in sidewall oxides 172 being formed on either side of the spacer 160. The titanium layer 78 is then deposited over the substrate and reacted with the exposed silicon or polysilicon to form titanium disilicide, as illustrated in the process step of FIG. 7. This is followed by implanting of P-type impurities into the titanium disilicide layers, which results in a layer of titanium disilicide 174 and a layer of titanium disilicide 176 being formed on either side of the spacer 160. In addition, a silicide layer 178 is formed over the base electrode 166 and a titanium disilicide layer 180 is formed over the spacer 160. The spacer 160 and its overlying layers, as will be described hereinbelow, perform no function, as the spacer 160 functions merely acts as a mask which is formed during the processing of the emitter electrode 56 of the NPN transistor. The spacer 116 is fabricated identical to the gate electrode 50 and the underlying gate oxide 36 with the exception that the oxide layer 158 is thicker, as it was formed during the step of formation of the oxide layer 38. The sidewall oxide layers 172 function in a similar manner to the sidewall oxide layer 70 and 72 to provide an offset function, with the thickness of the titanium layer 78 overlying the spacer of 160 and the sidewalls thereof also performing a spacing function.

After formation of the titanium disilicide layers 176 and 174 and the implanting of impurities therein, the impurities are driven down into the substrate to form P+ junctions 182 beneath the titanium disilicide layer 178 and P+ region 184 beneath the titanium disilicide layer 176. These are similar to P+ regions 120 and 122 of FIG. 8.

After formation of the P+ regions 182 and 184 by subsequent thermal cycling processes described above with reference to FIG. 8, local interconnects are then patterned to provide a local interconnect 186 for connection to the P+ region 182 and a local interconnect 188 for connection to the P+ region 184. The P+ regions 182 and 184 provide the collector and emitter of the NPN bipolar transistor with the N+ region 158 and the base contact 164 providing the base of the PNP transistor. Thereafter, contacts are formed similar to the contacts 128-138 of FIG. 9 in the same processing step.

Referring now to FIG. 13 there is illustrated an alternate embodiment of the present invention wherein the emitter electrode is patterned directly onto the substrate without requiring the opening 45 to be formed in the oxide layer 38. The structure of FIG. 13 is formed by removing any oxide over the intrinsic base region 44 and then patterning the layers 46, 48 and 49 in the same manner as described above with reference to FIGS. 4 and 5. This results in electrode 56' being formed on the substrate with the vertical wall of the emitter electrode 56' contacting the substrate. After formation thereof with the layers 58 and 60 overlying the emitter electrode 56', sidewall oxide layers 74' and 76' are formed on the vertical walls thereof in a similar manner to formation of the sidewall oxide layers 74 and 76 of FIG. 6. However, these sidewall oxide layers 74' and 76' are thicker to account for the overlap provided by the oxide layer 38 in FIGS. 4-6. Thereafter, silicide layers 84' and 86' are formed similar to silicide layers 84 and 86 of FIGS. 4-6 and doped to form P+ junctions 120' and 122'. By making sidewall oxide layers 74' and 76' thicker, this effectively spaces outward the edge of the silicide layers 120' and 122'. The result is that the lateral movement of the doping materials implanted into the silicide layers 84' and 86' is further removed from the resulting N+ junction formed beneath the electrode 56'. This, of course, can be adjusted by providing a thicker layer of titanium prior to formation and implanting of the silicide layers 84' and 86'.

In order to ensure that the edges of the source/drain junctions formed in the MOS transistor are sufficiently close to the edges of the channel region, it is necessary to provide some type of contact between the edge of the source/drain region and the edge of the channel region. This is due to the fact that the edge of the P+ region has been disposed further away from the vertical edge of the gate electrode, since the sidewall oxide layer formed around the gate of the MOS transistor is the same thickness as that of the sidewall oxide layers 74' and 76' formed on the vertical walls of the emitter electrode 56'. Since these sidewall oxide layers have been increased in thickness to account for the lack of overlapping of emitter electrode 56', it is necessary to provide a reach-through implant prior to depositing the titanium layer. The implant is a light P-type implant which is typically made after formation of the sidewall oxide layers. This implant will be relatively shallow and will diffuse laterally toward the edge of the channel region. The subsequent source/drain implant into the silicide layers will merge with this reach-through implant with the reach-through implant providing the contact with the edge of the channel region. This is a conventional process. The resulting structure removes the need for a patterning step by which the opening 45 is formed in the oxde layer 38, as illustrated in FIG. 4.

Referring now to FIGS. 14 and 15, there are illustrated the steps of forming a refractory metal gate for the MOS transistor and a refractory metal electrode for the bipolar transistor. The process for forming the BIC-MOS device is the same up to the step of FIG. 3 wherein a layer of refractory metal is deposited on the substrate in place of the poly layer 46. This refractory metal layer is tungsten which is then doped with impurities to approximately the level of the poly layer 46. A protective cap is then disposed over the substrate similar to the protective cap 49 of FIG. 4. The resulting layer of refractory metal and protective cap are then patterned to form an emitter electrode 188 and a gate electrode 190 with a protective cap 192 overlying the emitter electrode 188 and a protective cap 194 overlying the gate electrode 190. In addition, the refractory metal layer 196 is formed over the collector with a protective cap 198 formed over the collector electrode 196. Sidewall oxide layers 200 are then formed on the emitter electrode 188 and sidewall oxide layers 202 are formed on the vertical walls of the gate electrode 190. Thereafter, a layer of titanium is disposed over the substrate similar to the process illustrated in FIG. 7 resulting in the formation of silicide layers 78-86 in the MOS and bipolar regions respectively. In this reaction, the refractory metal formed in the emitter electrode 188 is reacted with the underlying silicon to form a silicide emitter electrode 196 and a silicide collector electrode 199. Thereafter, the unreacted titanium is removed leaving behind the silicide layers 78-86 and the silicide emitter electrode 196.

In summary, there is provided a process whereby two regions are defined in the substrate, one for forming an MOS transistor and one for forming an NPN or PNP bipolar transistor. After the regions are defined, a gate electrode is formed in the MOS transistor region separated from the silicon surface by a gate oxide and an emitter electrode is formed in the NPN bipolar region contacting the silicon surface spacer formed in the PNP bipolar region. The electrodes are formed from polycrystalline silicon and doped with n-type impurities and then a layer of oxide formed on the sidewalls thereof. The upper surfaces thereof are sealed with a layer of titanium and then a layer of oxide. Another layer of titanium is then sputtered over the entire surface contacting the source/drain regions of the MOS transistor and the base regions on either side of the emitter electrode in the bipolar transistor. The titanium is then reacted to form titanium disilicide on the exposed silicon and polysilicon surfaces. Thereafter, n-type impurities are implanted into the extrinsic base region of the NPN bipolar transistor, the emitter and collector of the PNP bipolar transistor and the source/drain regions of the MOS transistors. The protective oxide cap over the gate electrode and emitter electrode prevent p-type impurities from entering the emitter electrode. The unreacted titanium, in addition to the sidewall oxide surrounding the gate of the MOS transistor and the emitter electrode of the NPN bipolar transistor, functions to offset the implanted impurities from the edges thereof. A subsequent annealing step drives the impurities from the silicide down into the substrate to form a metallurgical junction to form the source/drain junctions and the extrinsic base. In addition, the implanted impurities in the emitter electrode are driven down into the substrate to form the emitter of the bipolar transistor.

Although the preferred embodiment has been described in detail, it should be understood that various changes, substitutions and alterations can be made therein without departing from the spirit and scope of the invention as defined by the appending claims.

What is claimed is:

1. A method for forming a bipolar transistor in a semiconductor body, comprising:

forming, in a first area of a surface of the semiconductor body, an intrinsic base of a first conductivity type;

forming an emitter electrode in contact with the intrinsic base, the emitter electrode doped with second conductivity type impurities;

forming a first layer of refractory metal on the surface of the emitter electrode;

forming a protective cap upon the refractory metal layer on the emitter electrode;

exposing a portion of the intrinsic base at a location adjacent said capped emitter electrode;

forming a second layer of refractory metal over the exposed portion of said intrinsic base and said capped emitter electrode;

reacting the refractory metal to form a silicide film at said exposed portion of said intrinsic base and said emitter electrode;

implanting impurities of the first conductivity type into the exposed portion of said intrinsic base; and driving the impurities implanted into the exposed portion of the intrinsic base.

2. The method of claim 1 further comprising:

depositing a layer of oxide to a predetermined thickness over the said first area, after said step of forming the protective cap upon the emitter electrode; and ansiotropically etching the oxide layer to leave sidewall oxide filaments on the capped emitter electrode, prior to said step of forming the second layer of refractory metal.

3. The method of claim 1, further comprising:

forming a layer of gate oxide to a predetermined thickness over a second area of the surface of the semiconductor body;

and wherein said step of forming the emitter electrode comprises:

depositing a layer of polycrystalline silicon over the first and second areas;

implanting impurities of a second conductivity type into the layer of polycrystalline silicon; and removing selected portions of the layer of polycrystalline silicon to define a gate electrode in the second area and the emitter electrode in the first area.

4. The method of claim 1 wherein the step of selectively implanting impurities of the first conductivity type comprises implanting the impurities into the silicide film formed from the second refractory layer to a predetermined depth within the silicide film.

5. The method of claim 1 wherein the refractory metal comprises titanium and the silicide comprises titanium disilicide.

6. The method of claim 1 wherein the step of driving the impurities comprises annealing the semiconductor body at a predetermined temperature for a predetermined period of time.

7. The method of claim 1 wherein the step of implanting impurities of the first conductivity type comprises:

exposing a portion of the first area of the surface of the semiconductor body including the exposed portion of the intrinsic base and the emitter electrode to an ion beam of impurities of the first conductivity type at a predetermined energy and dosage such that the impurities are implanted into the silicide film at said exposed portion of the intrinsic base but are blocked from being implanted into the silicide film on the emitter electrode.

8. The method of claim 1 and further comprising:

forming, in said first area of the surface of the semiconductor body, a buried collector of the second conductivity type connected to the surface of the silicon with a deep collector contact of the second conductivity type;

forming a collector electrode in contact with the deep collector contact so that, during the step of forming the first refractory metal layer on the emitter electrode a layer of refractory metal is also formed on said collector electrode and so that, during the step of forming the protective cap overlying the refractory metal layer on the emitter electrode, a protective cap is also formed overlying the refractory metal layer on the collector electrode.

9. The method of claim 1 and further comprising:

forming a layer of field oxide at the boundary of the first area of the surface of the semiconductor body.

10. The method of claim 3 wherein the steps of forming the first refractory metal layer on the gate electrode and the emitter electrode comprises:

depositing a layer of titanium over the polycrystalline silicon layer prior to the step of removing selected portions thereof;

and wherein said step of forming the protective cap comprises:

forming an oxide layer over the titanium layer prior to said step of removing selected portions of the polycrystalline silicon layer such that the layer of titanium and the oxide layer are patterned with the gate electrode and the emitter electrode.

11. A method for forming a shallow silicided base junction and source/drain junction for a BICMOS device in a semiconductor body, comprising:

forming an n-type buried collector with a deep collector connection to the silicon surface in a first n-type area of a surface of the semiconductor body;

forming a layer of gate oxide over the first n-type area and over a second n-type area of the surface of the semiconductor body, said second n-type area isolated from said first n-type area;

forming an intrinsic base at a location of said first n-type area overlying the buried collector;

forming an emitter opening in the gate oxide layer overlying the intrinsic base;

forming a layer of polycrystalline silicon over the emitter opening and in said second n-type area;

implanting N-type impurities into the polycrystalline silicon layer;

depositing a first layer of refractory metal over the polycrystalline layer;

forming a protective cap over the first layer of refractory metal of a material which is nonreactive with the first refractory metal layer;

patterning and etching the polycrystalline silicon layer, first refractory metal layer and protective cap layer to form a gate electrode in the second n-type area and an emitter electrode in the first n-type area over the emitter opening;

forming a sidewall oxide on the vertical surfaces of the polycrystalline silicon gate electrode and emitter electrode;

exposing a portion of the surface of the intrinsic base to define an extrinsic base area and adjacent the gate electrode to define source and drain regions;

forming a second layer of refractory metal contacting the define extrinsic base area, source and drain regions, and the emitter and gate electrodes;

reacting the portions of the first and second layers of refractory metal to form a silicide film upon said defined extrinsic base area, source and drain regions, and the emitter and gate electrodes;

implanting P-type impurities at a predetermined energy and dosage in the first are a such that the P-type impurities are implanted into the silicide layer over the extrinsic base area and the source and drain regions;

removing the portions of the second refractory metal layer not reacted to form silicide; and driving the impurity material into the substrate from the silicide film to contact the intrinsic base in the first area, and to form metallurgical junctions beneath the silicide film in the second area and driving the implanted impurities in the emitter electrode into the intrinsic base to form a metallurgical junction.

12. The method of claim 11 wherein the second N-type area is separated from the first n-type area by field oxide and wherein the intrinsic base is separated from the deep collector connection by field oxde.

13. The method of claim 11 wherein the step of forming the intrinsic base beneath the gate oxide layer comprises implanting into a selected portion of the first n-type area through the gate oxide layer p-type impurities at predetermined energy and dose to form a p-type region beneath the gate oxide layer.

14. The method of claim 11 wherein the step of forming the sidewall oxide comprises:

depositing a layer of oxide to a predetermined thickness over the said first and second n-type areas, after said step of forming the protective cap upon the emitter electrode; and anisotropically etching the oxide layer to leave sidewall oxide filaments on the capped emitter and gate electrodes, prior to said step of forming the second layer of refractory metal.

15. The method of claim 11 wherein the step of implanting p-type impurities comprises implanting the impurities to a depth in the silicide film in the extrinsic base area and the source and drain regions.

16. The method of claim 11 wherein the step of forming the first and second layers of refractory metal comprises sputtering of refractory metal onto the first and second n-type areas to a predetermined thickness.

17. The method of claim 11 wherein the step of driving the impurities comprises annealing the semiconductor body at a predetermined temperature for a predetermined amount of time.

18. The method of claim 12 wherein the refractory metal comprises titanium and the silicide comprises titanium disilicide.

19. A method for forming shallow silicided junctions in a BICMOS device, comprising:

defining an MOS region and a bipolar region at a surface of a semiconductor body, the bipolar region having an intrinsic base of the first conductivity type disposed within said semiconductor body;

forming a doped polysilicon emitter electrode in the bipolar region in contact with the surface of the intrinsic base, and of a conductivity type opposite to that of the intrinsic base;

forming a gate electrode in the MOS region and separated therefrom b y a layer of gate oxide;

forming a first layer of refractory metal with a protective cap that is nonreactive therewith over the emitter and gate electrodes;

forming a layer of silicide over a portion of the surface of the intrinsic base adjacent the capped emitter electrode and over a portion of the MOS region adjacent the capped gate electrode, the step for forming the silicide over the intrinsic base region and the MOS emitter region also reacting the refractory metal over the gate and emitter electrodes with the surface thereof to form a silicide thereover;

implanting impurities of the first conductivity type into the silicide layers not covered by the protective cap; and driving the impurities in the silicide layers down into the into the intrinsic base, and into MOS region to form metallurigical junctions and driving the impurities of the second conductivity type in the emitter electrode down into the substrate to form a metallurgical junction therebeneath.

20. The method of claim 19 and further comprising forming a transistor having a base area of the second conductivity type, comprising:

defining an area of the second conductivity type at the surface of the semiconductor body;

forming a spacer over the defined area during formation of the gate electrode;

forming silicide film in the defined area on two sides of the spacer during the step of forming the silicide in the MOS region;

implanting impurities of the first conductivity type into the silicide film in the defined area during implanting of impurities into the silicide film in the MOS region;

driving the implanted impurities to form metallurgical junctions beneath the silicide film during the step of driving of the impurities in the MOS region.

21. The method of claim 19 wherein the step of forming the emitter electrode and the gate electrode comprises:

forming an oxide layer over the surface of the MOS region;

forming an oxide layer over the surface of the bipolar region;

etching a contact through the oxide layer over the surface of the bipolar region at a location above the intrinsic base;

forming a layer of polysilicon over the oxide layers and the contact via;

introducing impurities of the second conductivity type into the polysilicon layer;

depositing a layer of refractory metal over the polysilicon layer;

forming an oxide layer as said protective cap over the refractory metal layers; and removing selected portions of the polysilicon layer, refractory metal layer and protective cap to form the emitter electrode and the gate electrode.

22. A method for forming a BICMOS device, comprising:

providing a p-type substrate;

forming an n-type region at a surface of said substrate;

providing an n-type buried collector with a deep collector connection to the surface, said buried collector underlying a first area of the n-type region;

defining a second area of the n-type region isolated from the first area;

forming a layer of gate oxide over the first and second areas to a predetermined thickness;

forming a p-type intrinsic base disposed within the first area of the n-type region;

forming an emitter opening in the gate oxide layer overlying the intrinsic base;

forming a first layer of refractory meal over the first and second areas to a predetermined thickness;

implanting n-type impurities into the first layer of refractory metal;

forming a protective oxide cap over the first layer of refractory metal;

etching the first refractory metal layer and protective cap in selected locations to form a gate electrode in the second area and an emitter electrode in the first area overlying the emitter opening;

forming a sidewall oxide on the vertical surfaces of the gate electrode and emitter electrode;

exposing a portion of the surface of the n-type region adjacent the capped emitter electrode in the first area to define an extrinsic base area and a portion of the surface of the n-type region adjacent the capped gate electrode in the second area to define a source/drain region;

forming a second layer of refractory metal over the contacting the exposed portions of the n-type region;

reacting the portions of the first and second layers of refractory metal contacting exposed portions of the n-type region to form a silicide film;

implanting p-type impurities at a predetermined energy and dosage into the silicide film;

removing the portions of the refractory metal not reacted to form a silicide; and driving the impurity material into the n-type region from the silicide film to form metallurgical junctions beneath the silicide in the second area and to contact the intrinsic base in the first area, and driving the implanted impurities in the emitter electrode into the intrinsic base to form a metallurgical junction.

* * * * *